United States Patent
Tuers et al.

(10) Patent No.: US 9,678,832 B2
(45) Date of Patent: Jun. 13, 2017

(54) STORAGE MODULE AND METHOD FOR ON-CHIP COPY GATHER

(71) Applicant: SanDisk Technologies Inc., Plano, TX (US)

(72) Inventors: Daniel E. Tuers, Kapaa, HI (US); Abhijeet Manohar, Bangalore (IN); Sergei Gorobets, Edinburgh (GB)

(73) Assignee: SanDisk Technologies LLC, Plano, TX (US)

( * ) Notice: Subject to any disclaimer, the term of this patent is extended or adjusted under 35 U.S.C. 154(b) by 200 days.

(21) Appl. No.: 14/595,939

(22) Filed: Jan. 13, 2015

(65) Prior Publication Data

US 2016/0085464 A1 Mar. 24, 2016

(30) Foreign Application Priority Data

Sep. 18, 2014 (IN) .............. 4553/CHE/2014

(51) Int. Cl.
- *G06F 11/10* (2006.01)
- *G06F 11/07* (2006.01)
- *G06F 3/06* (2006.01)
- *G11C 16/08* (2006.01)
- *G11C 29/04* (2006.01)
- *G11C 7/10* (2006.01)

(52) U.S. Cl.
CPC .......... *G06F 11/1068* (2013.01); *G06F 3/064* (2013.01); *G06F 3/065* (2013.01); *G06F 3/0619* (2013.01); *G06F 3/0673* (2013.01); *G06F 11/073* (2013.01); *G06F 11/076* (2013.01); *G06F 11/079* (2013.01); *G06F 11/1076* (2013.01); *G11C 16/08* (2013.01); *G11C 7/1009* (2013.01); *G11C 2029/0411* (2013.01); *G11C 2207/2236* (2013.01)

(58) Field of Classification Search
CPC ........ G06F 3/0619; G06F 3/065; G06F 3/064; G06F 3/0673; G06F 11/073; G06F 11/076; G06F 11/079; G06F 11/1068; G06F 11/1076
USPC .................. 714/4, 764, 766, 807; 711/165
See application file for complete search history.

(56) References Cited

U.S. PATENT DOCUMENTS

| | | | |
|---|---|---|---|
| 7,212,440 B2 | 5/2007 | Gorobets | |
| 7,345,928 B2 * | 3/2008 | Li | ............ G11C 11/5628 365/185.01 |
| 7,805,662 B2 | 9/2010 | Ma et al. | |
| 7,814,401 B2 | 10/2010 | Alrod et al. | |
| 8,301,912 B2 | 10/2012 | Lin et al. | |
| 8,675,417 B2 | 3/2014 | Litsyn et al. | |
| 8,885,428 B2 | 11/2014 | Chen et al. | |

(Continued)

*Primary Examiner* — John J Tabone, Jr.
(74) *Attorney, Agent, or Firm* — Brinks Gilson & Lione

(57) ABSTRACT

A storage module and method for on-chip copy gather are provided. In one embodiment, a storage module is provided with a memory comprising a plurality of word lines and a plurality of data latches. The memory copies data from a first word line into a first data latch and copies data from a second word line into a second data latch. The memory then copies only some of the data from the first data latch and only some of the data from the second data latch into a third data latch. After that, the memory copies the data from the third data latch to a third word line. In another embodiment, a storage module is provided comprising a memory and an on-chip copy gather module. Other embodiments are provided.

32 Claims, 8 Drawing Sheets

(56) References Cited

U.S. PATENT DOCUMENTS

| | | | |
|---|---|---|---|
| 8,902,647 B1* | 12/2014 | Raghu | G11C 16/3427 365/185.02 |
| 8,976,587 B2* | 3/2015 | Yoon | G11C 11/56 365/185.05 |
| 9,093,158 B2* | 7/2015 | Raghu | G11C 16/3427 |
| 2006/0023507 A1 | 2/2006 | Mangan et al. | |
| 2006/0126393 A1* | 6/2006 | Li | G11C 11/5628 365/185.22 |
| 2008/0158973 A1* | 7/2008 | Mui | G11C 7/1006 365/185.18 |
| 2008/0279009 A1* | 11/2008 | Park | G11C 16/10 365/185.18 |
| 2011/0157999 A1* | 6/2011 | Yoon | G11C 16/10 365/185.22 |
| 2012/0246395 A1* | 9/2012 | Cho | G06F 12/0246 711/103 |
| 2013/0024605 A1* | 1/2013 | Sharon | G06F 11/1072 711/103 |
| 2013/0086304 A1* | 4/2013 | Ogawa | G06F 3/061 711/103 |
| 2013/0141972 A1* | 6/2013 | Yoon | G11C 11/56 365/185.03 |
| 2013/0229868 A1* | 9/2013 | Koh | G11C 11/5628 365/185.03 |
| 2013/0326141 A1 | 12/2013 | Marcu et al. | |
| 2014/0126293 A1 | 5/2014 | Tsai et al. | |
| 2014/0133234 A1 | 5/2014 | Conley et al. | |
| 2014/0157087 A1 | 6/2014 | Yurzola et al. | |
| 2014/0219023 A1 | 8/2014 | Li et al. | |
| 2014/0250348 A1 | 9/2014 | Harari et al. | |
| 2014/0269071 A1* | 9/2014 | Pandya | G11C 16/10 365/185.11 |
| 2014/0317367 A1* | 10/2014 | Abei | G06F 3/065 711/162 |
| 2015/0006800 A1* | 1/2015 | Alrod | G06F 11/1068 711/103 |
| 2015/0046770 A1 | 2/2015 | Luo et al. | |
| 2015/0081964 A1* | 3/2015 | Kihara | G06F 3/0611 711/114 |
| 2015/0162087 A1* | 6/2015 | Raghu | G11C 16/3427 365/185.11 |
| 2016/0077912 A1* | 3/2016 | Mateescu | G06F 11/1068 714/764 |

* cited by examiner

STORAGE MODULE AND METHOD FOR ON-CHIP COPY GATHER

PRIORITY

This application claims priority to India Patent Application No. 4553/CHE/2014, filed on Sep. 18, 2014, entitled "Storage Module and Method for On-Chip Copy Gather," the entire disclosure of which is hereby incorporated by reference.

BACKGROUND

There is often a need to perform garbage collection and other compactions operations to copy a word line of data from a source page to a destination page in memory. There are several ways in which the data can be moved. For example, an "off-chip copy" operation can be used, in which the word line of data is read from a source page and transferred over a bus to a controller and is then transferred back over the bus to the memory and written to a destination page. To avoid transferring data back and forth over the controller-memory bus, an "on-chip copy" operation can be used, in which a word line of data is read from a source page, written into data latches in the memory chip, and then written to a destination page. Although on-chip copy is faster than off-chip copy since it avoids toggling the data between the controller and the memory, there are some disadvantages associated with on-chip copy. For example, on-chip copy requires that data be programmed in the destination page in the same order/format as the data is stored in the source page. As another example, on-chip copy can be susceptible to the accumulation of program and sense errors, as moving data many times with an on-chip copy operation can cause decode errors. To address this issue, a hybrid off-chip/on-chip copy operation can be used, in which data read from the source page is both stored in data latches in the memory (as in an on-chip copy operation) and sent to the controller (as in an off-chip copy operation), which tests the integrity of the data. If the data is valid, the data stored in the data latches in the memory is simply programmed to the destination page without toggling the data back from the controller to the memory, thereby cutting the data toggle time in half compared to using a typical off-chip copy operation.

Overview

Embodiments of the present invention are defined by the claims, and nothing in this section should be taken as a limitation on those claims.

By way of introduction, the below embodiments relate to a storage module and method for on-chip copy gather. In one embodiment, a storage module is provided with a memory comprising a plurality of word lines and a plurality of data latches. The memory copies data from a first word line into a first data latch and copies data from a second word line into a second data latch. The memory then copies only some of the data from the first data latch and only some of the data from the second data latch into a third data latch. After that, the memory copies the data from the third data latch to a third word line.

In another embodiment, a storage module is provided comprising a memory and an on-chip copy gather module. The on-chip copy gather module is configured to use a plurality of data latches in the memory to gather data from portions of source word lines in the memory and copy the gathered data to a destination word line in the memory. In yet another embodiment, a storage module is provided comprising a memory and a controller. The controller is configured to gather data from portions of a plurality of source word lines in the memory and copy the gathered data to a destination word line while preventing accumulation of errors from bad columns in the memory.

Other embodiments are possible, and each of the embodiments can be used alone or together in combination. Accordingly, various embodiments will now be described with reference to the attached drawings.

DETAILED DESCRIPTION OF THE PRESENTLY PREFERRED EMBODIMENTS

As discussed above, one disadvantage associated with a typical on-chip copy operation is that it requires that data be programmed in a destination page in the same order as the data is stored in a source page. In one embodiment, a new operation is disclosed (referred to herein as "on-chip copy gather") that allows data to be stored in a different order and also allows data to be gathered from multiple word lines. Before turning to these and other embodiments, the following paragraphs provide a discussion of exemplary storage modules that can be used with these embodiments. Of course, these are just examples, and other suitable types of storage modules can be used.

Figure 1:
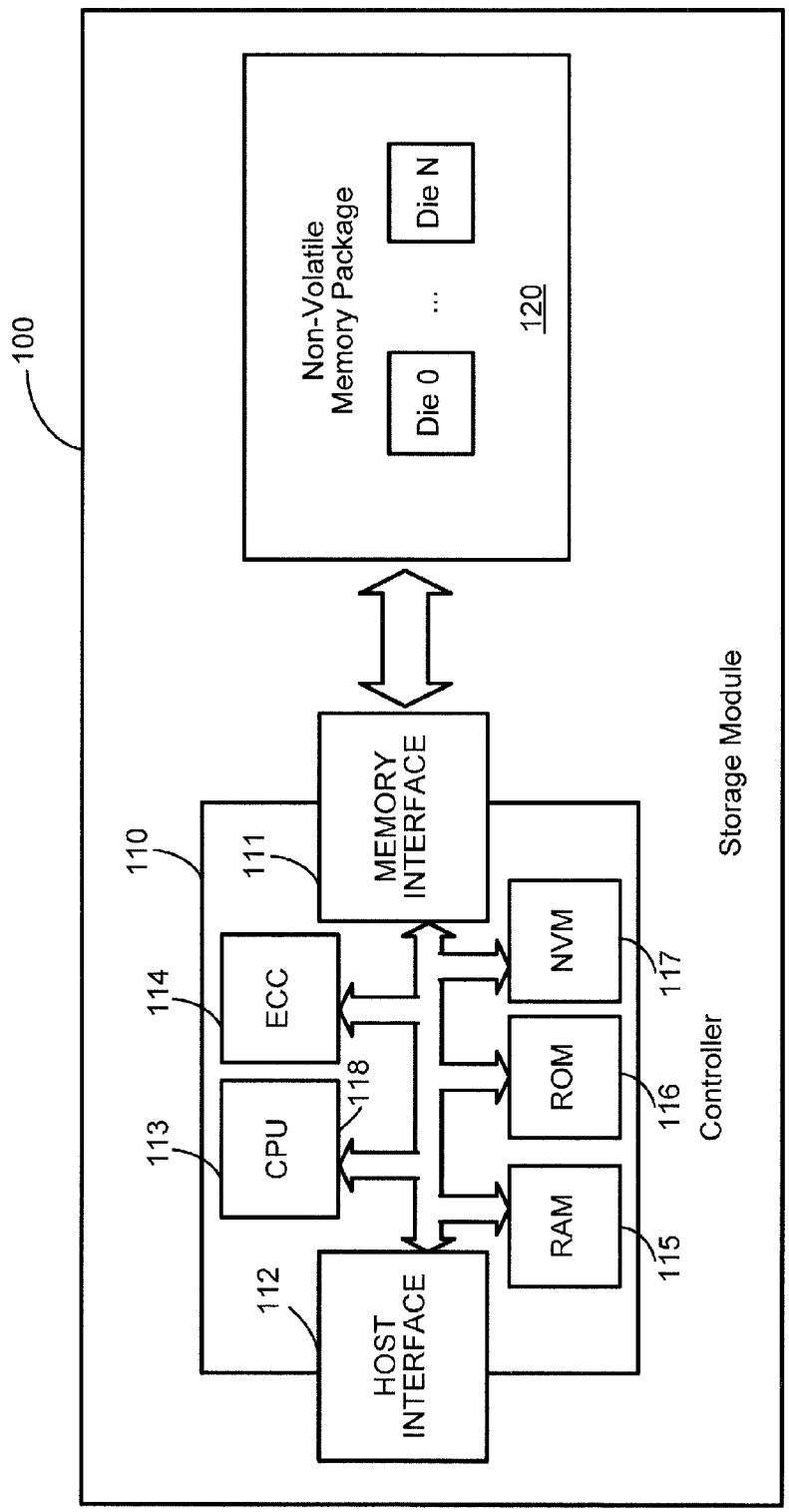
FIG. 1 is a block diagram of an exemplary storage module of an embodiment.

As illustrated in FIG. 1, a storage module 100 of one embodiment comprises a storage controller 110 and a non-volatile memory package 120 containing a plurality of memory dies (Die 0 to Die N). Although only one non-volatile memory package is shown in FIG. 1, it should be understood that the storage module 100 can have more than one non-volatile memory package. Also, while multiple memory dies are shown, it should be understood that a single memory die can be used. As will be discussed below, the memory dies can be implemented with any suitable technology, including, but not limited to, NAND, bit cost scaling (BiCS) memory, and resistive random-access memory (ReRAM).

The storage controller 110 comprises a memory interface 111 for interfacing with the non-volatile memory package 120 and a host interface 112 for placing the storage module 100 operatively in communication with a host controller. As used herein, the phrase "operatively in communication with" could mean directly in communication with or indirectly in (wired or wireless) communication with through one or more components, which may or may not be shown or described herein.

Figure 2A:
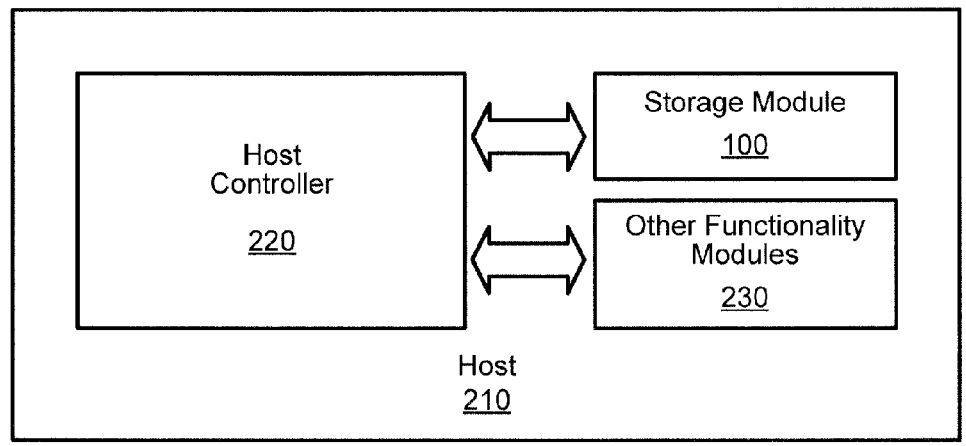
FIG. 2A is a block diagram of a host of an embodiment, where the exemplary storage module of FIG. 1 is embedded in the host.

As shown in FIG. 2A, the storage module 100 can be embedded in a host 210 having a host controller 220. That is, the host 210 embodies the host controller 220 and the storage module 100, such that the host controller 220 interfaces with the embedded storage module 100 to manage its operations. For example, the storage module 100 can take the form of an iNAND™ eSD/eMMC embedded flash drive by SanDisk Corporation, storage devices that use NVMe, SAS and SATA host interfaces, or, more generally, any type of solid state drive (SSD) (e.g., an enterprise solid-state storage device), a hybrid storage device (having both a hard disk drive and a solid state drive), and a memory caching system. The host controller 220 can interface with the embedded storage module 100 using, for example, an eMMC host interface or a UFS interface. The host 210 can take any form, such as, but not limited to, a mobile phone, a tablet computer, a digital media player, a game device, a personal digital assistant (PDA), a mobile (e.g., notebook, laptop) personal computer (PC), or a book reader. As shown in FIG. 2A, the host 210 can include optional other functionality modules 230. For example, if the host 210 is a mobile phone, the other functionality modules 230 can include hardware and/or software components to make and place telephone calls. As another example, if the host 210 has network connectivity capabilities, the other functionality modules 230 can include a network interface. Of course, these are just some examples, and other implementations can be used. Also, the host 210 can include other components (e.g., an audio output, input-output ports, etc.) that are not shown in FIG. 2A to simplify the drawing. It should be noted that while the host controller 220 can control the storage module 100, the storage module 100 can have its own controller to control its internal memory operations. Also, in general, a host controller can be any controller capable of interfacing with the storage module, be it a controller in monolithic form, an entire controller, or a separate functionality module.

Figure 2B:
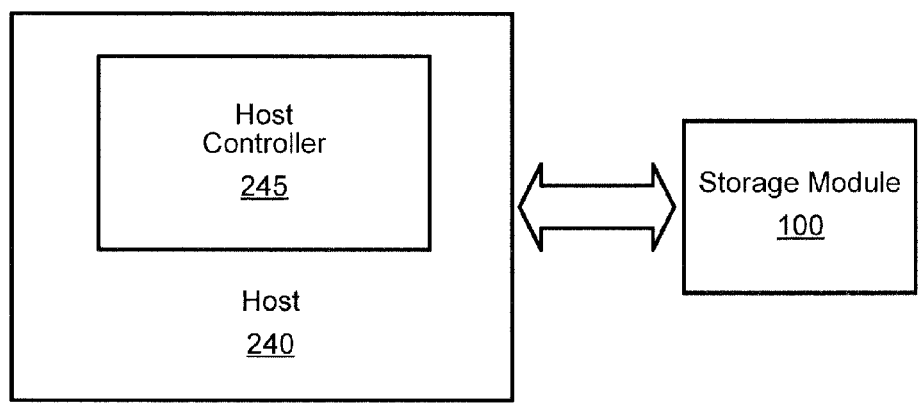
FIG. 2B is a block diagram of the exemplary storage module of FIG. 1 removably connected to a host, where the storage module and host are separable, removable devices.

As shown in FIG. 2B, instead of being an embedded device in a host, the storage module 100 can have physical and electrical connectors that allow the storage module 100 to be removably connected to a host 240 (having a host controller 245) via mating connectors. As such, the storage module 100 is a separate device from (and is not embedded in) the host 240. In this example, the storage module 100 can be a handheld, removable memory device, such as a Secure Digital (SD) memory card, a microSD memory card, a Compact Flash (CF) memory card, a universal serial bus (USB) device (with a USB interface to the host), or a solid-state drive (SSD), and the host 240 is a separate device, such as a mobile phone, a tablet computer, a digital media player, a game device, a personal digital assistant (PDA), a mobile (e.g., notebook, laptop) personal computer (PC), or a book reader, for example.

In FIGS. 2A and 2B, the storage module 100 is in communication with a host controller 220 or host 240 via the host interface 112 shown in FIG. 1. The host interface 112 can take any suitable form, such as, but not limited to, an eMMC host interface, a UFS interface, and a USB interface.

The host interface 110 in the storage module 110 conveys memory management commands from the host controller 220 (FIG. 2A) or host 240 (FIG. 2B) to the storage controller 110, and also conveys memory responses from the storage controller 110 to the host controller 220 (FIG. 2A) or host 240 (FIG. 2B). Also, it should be noted that when the storage module 110 is embedded in the host 210, some or all of the functions described herein as being performed by the storage controller 110 in the storage module 100 can instead be performed by the host controller 220.

Returning to FIG. 1, the storage controller 110 comprises a central processing unit (CPU) 113, an error correction code (ECC) module 114 operative to encode and/or decode an ECC code word with data and syndrome bits, read access memory (RAM) 215, read only memory (ROM) 116 which can store firmware for the basic operations of the storage module 100, and a non-volatile memory (NVM) 117 which can store a device-specific key used for encryption/decryption operations, when used. The storage controller 110 can be implemented in any suitable manner. For example, the storage controller 110 can take the form of a microprocessor or processor and a computer-readable medium that stores computer-readable program code (e.g., software or firmware) executable by the (micro)processor, logic gates, switches, an application specific integrated circuit (ASIC), a programmable logic controller, and an embedded microcontroller, for example. Suitable controllers can be obtained from SanDisk or other vendors. The storage controller 110 can be configured with hardware and/or software to perform the various functions described below and shown in the flow charts. Also, some of the components shown as being internal to the storage controller 110 can also be stored external to the storage controller 110, and other component can be used. For example, the RAM 115 (or, an additional RAMS unit) can be located outside of the controller die and used as a page buffer for data read from and/or to be written to the memory package 120.

The memory dies in the non-volatile memory package 120 can also take any suitable form. For example, in one embodiment, one or more of the memory dies take the form of a solid-state (e.g., flash) memory and can be one-time programmable, few time programmable, or many-time programmable. The memory dies can also use single-level cell (SLC), multiple-level cell (MLC), triple-level cell (TLC), or other memory technologies, now known or later developed. Also, the memory dies can be a two-dimensional memory or a three-dimensional memory.

As mentioned above, in a typical on-chip copy operation, data from a source word line (page) is read into a data latch in the memory, and then the data is written from the data latch to a destination word line is the same order/format. However, there are situations where it is desirable to copy only part of the data from the source word line to the destination word line. For example, a word line may store a plurality of error correction code (ECC) pages (or code words). As used herein, an ECC page (or code word) refers to a unit of data that contains the data itself and ECC parity (or syndrome) bits that can be used by the ECC engine 114 to decode the code word to determine if an error exists in the code word. If a code word has an error, it may be desired not to copy that code word to a destination word line.

Figure 3:
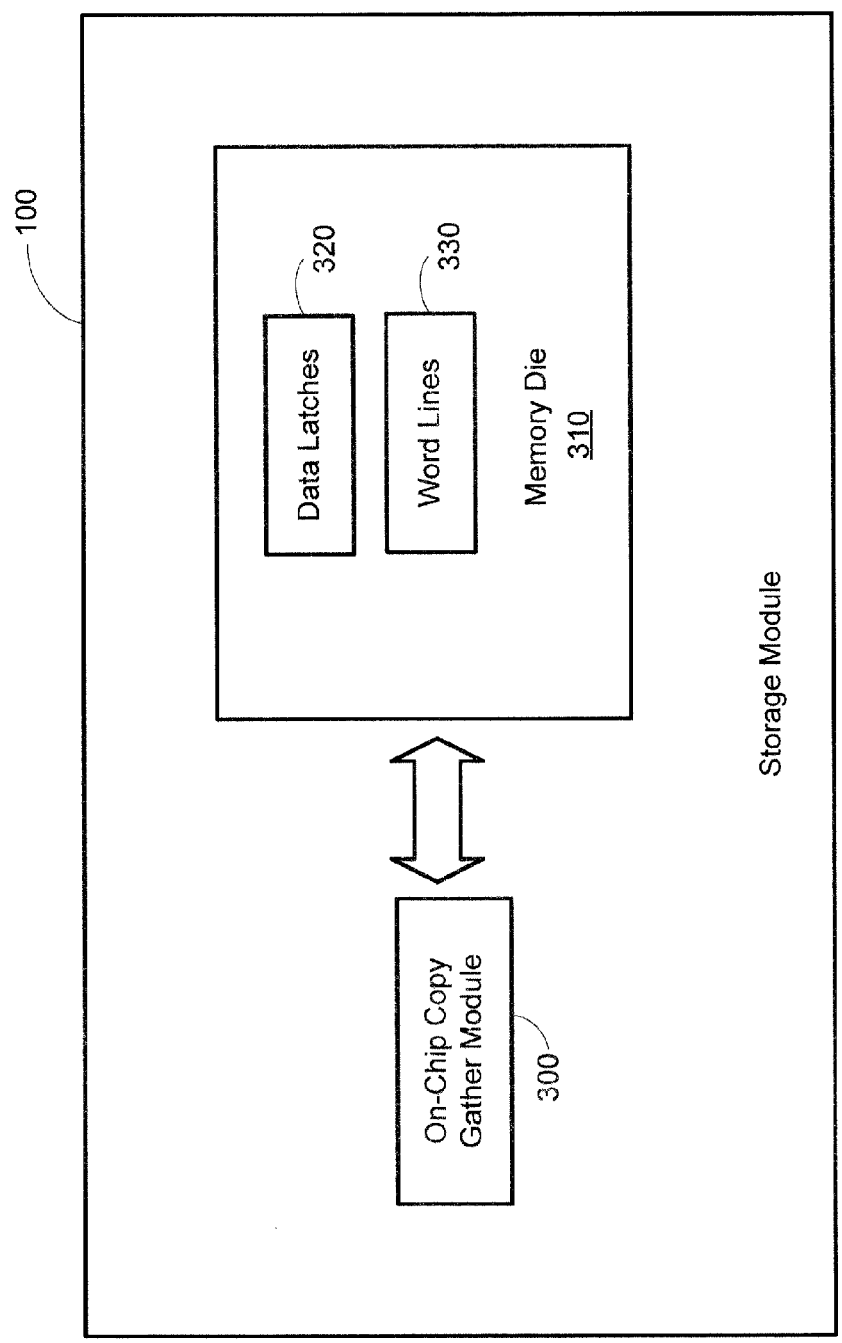
FIG. 3 is a block diagram of a storage module of an embodiment.

To address this situation and as shown in FIG. 3, the storage module 100 in one embodiment can be equipped with an on-chip copy gather module 300 that is in communication with a memory die 310 having a plurality of data latches 320 and a plurality of word lines 330. The on-chip copy gather module 300 is configured to gather data from portions of source word line(s) and copy the gathered data to a destination word line. Because this embodiment allows data to be "gathered" from various word lines rather than copying all the data from a single word line, this embodiment allows specific code words to be copied from multiple word lines, thereby avoiding copying undesired code words in the on-chip copy operation.

The on-chip copy gather module 300 can be implemented in any, suitable way. For example, the on-chip copy gather module 300 can be implemented as hardware only or hardware running software, either inside the storage module's controller 110 (Figure) or outside of the controller 110. The on-chip copy gather module 300 may include, for example, an application specific integrated circuit (ASIC), a Field Programmable Gate Array (FPGA), a circuit, a digital logic circuit, an analog circuit, a combination of discrete circuits, gates, or any other type of hardware or combination thereof.

Figure 4:
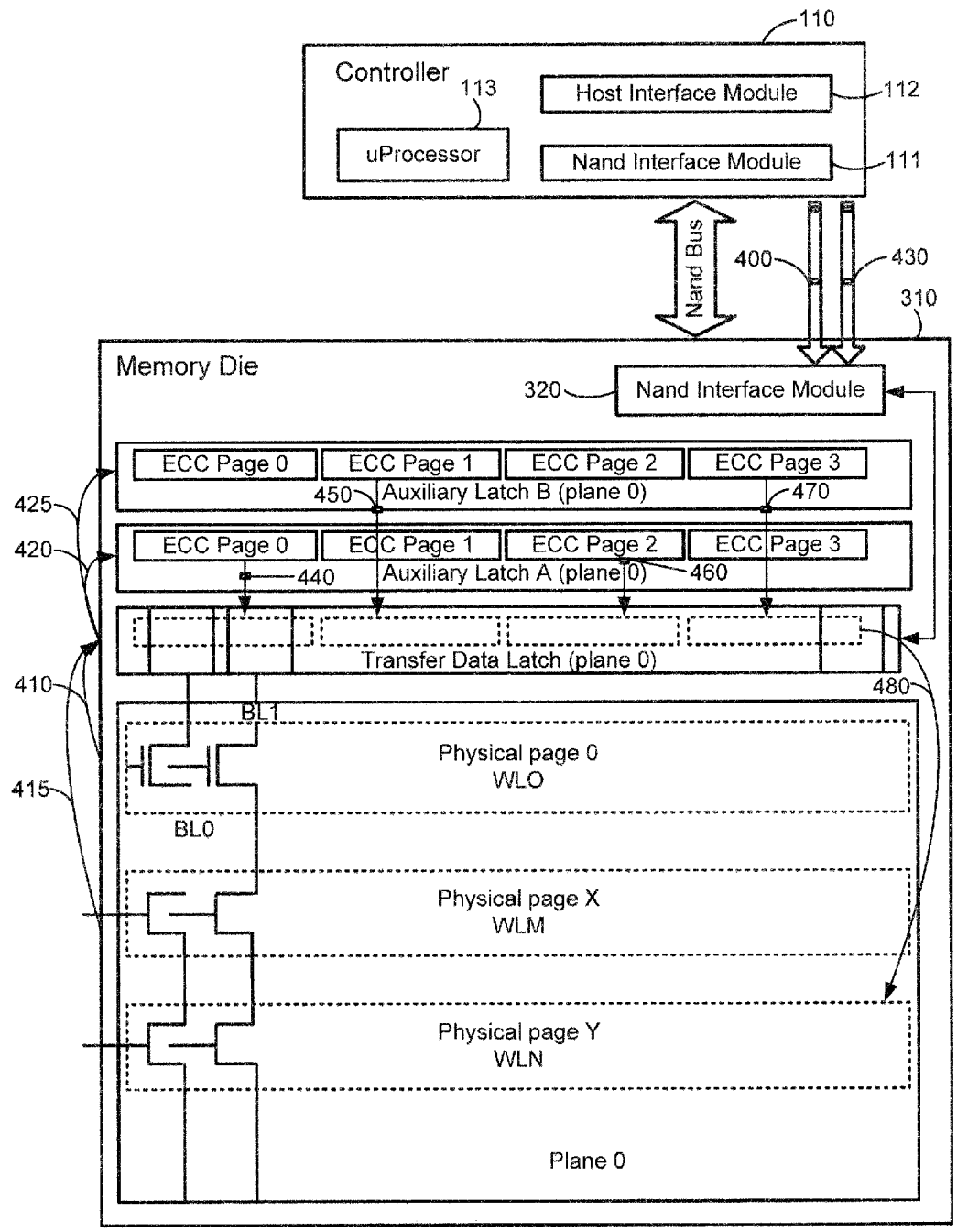
FIG. 4 is a diagram that illustrates an on-chip copy gather operation of an embodiment.
Figure 5:
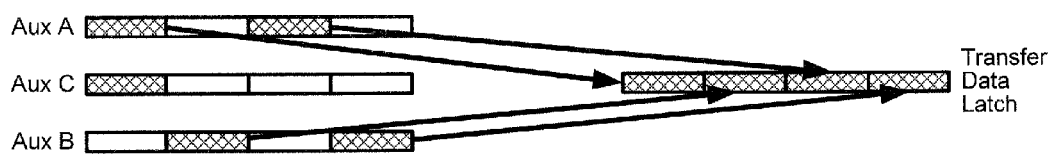
FIG. 5 is an illustration of an on-chip copy gather operation of an embodiment that maintains column alignment.

FIG. 4 is an illustration of one particular implementation, in which the one-chip copy gather module is implemented in the controller 110. Here, the controller 110 is configured to (e.g., by hardware in the processor 113 alone or by the processor 113 running software, which can be stored in any suitable memory location in the storage module 100) perform an on-chip copy gather operation using data latches in the memory die 310. In this embodiment, each word line corresponds to a physical page of memory, and each word line stores four ECC pages (or code words). In the example shown in FIG. 4, physical page 0 stores word line 0 (which stores four ECC pages), physical page X stores word line M, and physical page Y stores word line N. It should be noted that this is merely an example, and other implementations can be used. For example, while one example may be discussed in terms of single-level cells (SLC), other implementation can be used, including, but not limited to, any multiple-level cells (MLC) (e.g., three-bits-per cell, etc.) where there are enough data latches. Also, as noted below, X2-to-X2 on-chip copying may be used.

In operation, the controller 110 sends sense commands to the NAND interface module 320 in the memory die 310 to copy data from two or more word lines (in this example, from word line 0 and word line N) (act 400). In this example, the controller 110 commands the memory die 310 to sense page 0 and transfer it to auxiliary latch A. In response to this command, the memory die 310 copies data from physical page 0 to a transfer data latch (act 410), and then from the transfer data latch to auxiliary latch A (act 420). Similarly, the controller 110 commands the memory die 310 to sense page X and transfer it to auxiliary latch B, in response to which the memory die 310 copies data from physical page X to the transfer data latch (act 415), and then from the transfer data latch to auxiliary latch B (act 425). In this embodiment, there is one transfer data latch per memory plane, with the auxiliary latches being used to storage various word lines, so code words can be gathered from them. However, in other embodiments, other latch arrangements can be used. Also, while this example shows two word lines being copied into two auxiliary latches, it should be understood that additional auxiliary latches can be used, so that more than two word lines can be copied into those that additional auxiliary latches.

The controller 110 waits for the memory die 310 to signal that it has completed the sense and transfer operations, and then sends a latch merge command to the memory die 310 (act 430). In this embodiment, the latch merge command allows data to be moved across columns within the latches. While any suitable command syntax can be used, in one embodiment, the command contains the following parameter format: source column, source latch name, destination column, destination latch name, and length of copy (in this example, this instruction assumes a start at offset 0 with a length of the ECC page.) In some environments, this parameter format may be the most flexible and allow the memory die 310 to be ignorant of the logical ECC page size (the ECC page is sometimes referred to herein as a Flash memory unit, or FMU). Of course, this is just one example, and other command syntaxes can be used. For example, in an alternative embodiment, the command syntax can allow the mixing of controller data and latch data (e.g., to mix refreshed data or new incoming host data).

In this example, the latch merge command instructs the memory die 310 to move ECC page 0 from latch A to page 0 in the transfer data latch (act 440), move ECC page 1 from latch B to page 1 in the transfer data latch (act 450), move ECC page 2 from latch A to page 2 in the transfer data latch (act 460), and move ECC page 3 from latch B to page 3 in the transfer data latch (act 470). By executing these commands, the memory die 310 "gathers" parts of the word lines (ECC pages 0 and 2 from word line 0 and ECC pages 1 and 3 from word line M) into the transfer data latch. The memory die 310 then programs the data in the transfer data latch into word line N in physical page Y (act 480).

There are several advantages associated with these embodiments. First, unlike prior on-chip copy operations in which either all of the ECC pages in word line 0 or all of the ECC pages in word line M would be copied to word line N, in this embodiment, only some of the ECC pages from those word lines are copied. By gathering the data from the word lines before on-chip copying them, this embodiment allows undesired ECC pages (e.g., those with errors) from those two word lines from being part of the on-chip copy operation. Also, these embodiments can be used to allow FMUs to be merged on the memory die during SLC/X2 copy and X3 fold. This increases the performance of the memory die by not having to (a) create an update block (UB) (in the case of X3) in order to do an intact fold operation and (b) do an off-chip copy when doing fragment compaction on SLC/X2. This can improve the performance of the on-chip copy operation by ~5-10% and can decreases power usage by not having to toggle data to and from the controller 100 (i.e., 10%+power reduction). Also, these embodiments can decrease write amplification for X3 folding by removing the need to move data through X1 blocks (e.g. by a write-amplification factor (WAF) of 1.5-0.9).

Figure 6:
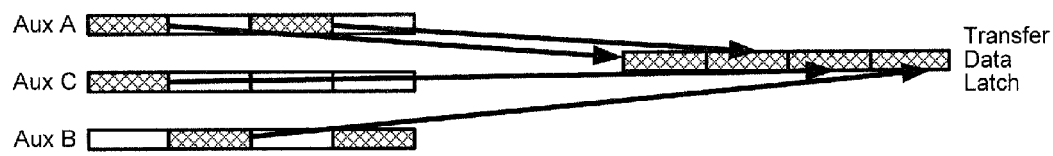
FIG. 6 is an illustration of an on-chip copy gather operation of an embodiment that does not have alignment restrictions.

In the example shown in FIG. 4, each ECC page that was moved maintained column alignment. For example, ECC page 0 from auxiliary latch A was moved to ECC page 0 in the transferred data latch, ECC page 1 from auxiliary latch B was moved to ECC page 1 in the transferred data latch, etc. This column alignment is shown diagrammatically in Figures, which also shows data in another auxiliary latch (latch C) not being part of the on-chip copy gather operation. However, instead of maintaining column alignment, ECC pages from various source word lines can be copied to different page positions in the destination word line. This is shown in FIG. 6, where page 2 from auxiliary latch A is move to ECC page 1 in the transfer data latch, ECC page 0 from auxiliary latch C is moved to page 2 in the transfer data latch, and ECC page 1 from auxiliary latch B is moved to page 3 in the transfer data latch.

However, when the controller 100 is allowed to merge data from several FMUs (i where column alignment is not maintained), a problem can occur if there is an accumulation of errors from the bad columns. This is illustrated in FIG. 7.

Figure 7:
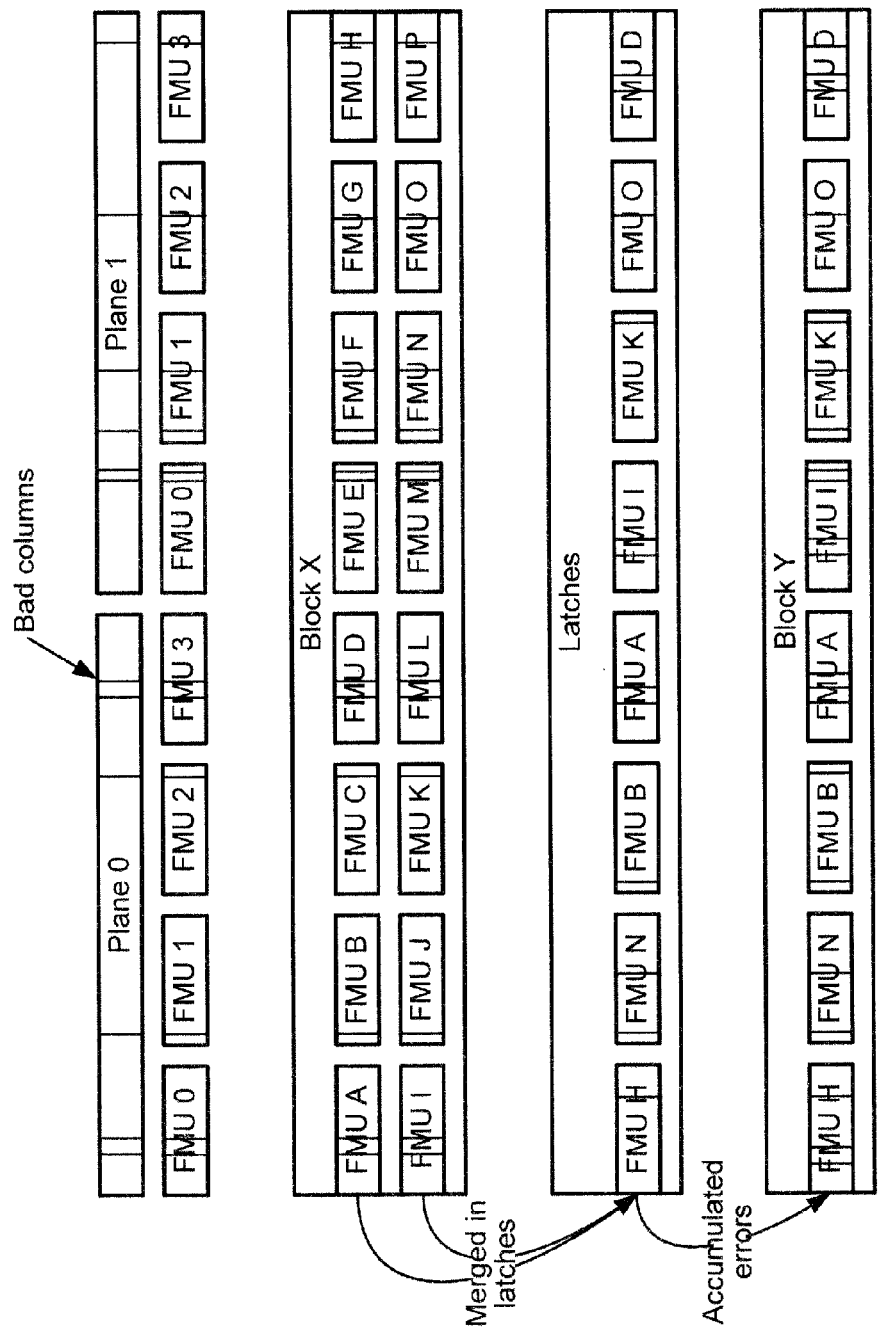
FIG. 7 is an illustration of accumulated errors that may be encountered when using an on-chip copy gather operation of an embodiment that does not have alignment restrictions.
Figure 8:
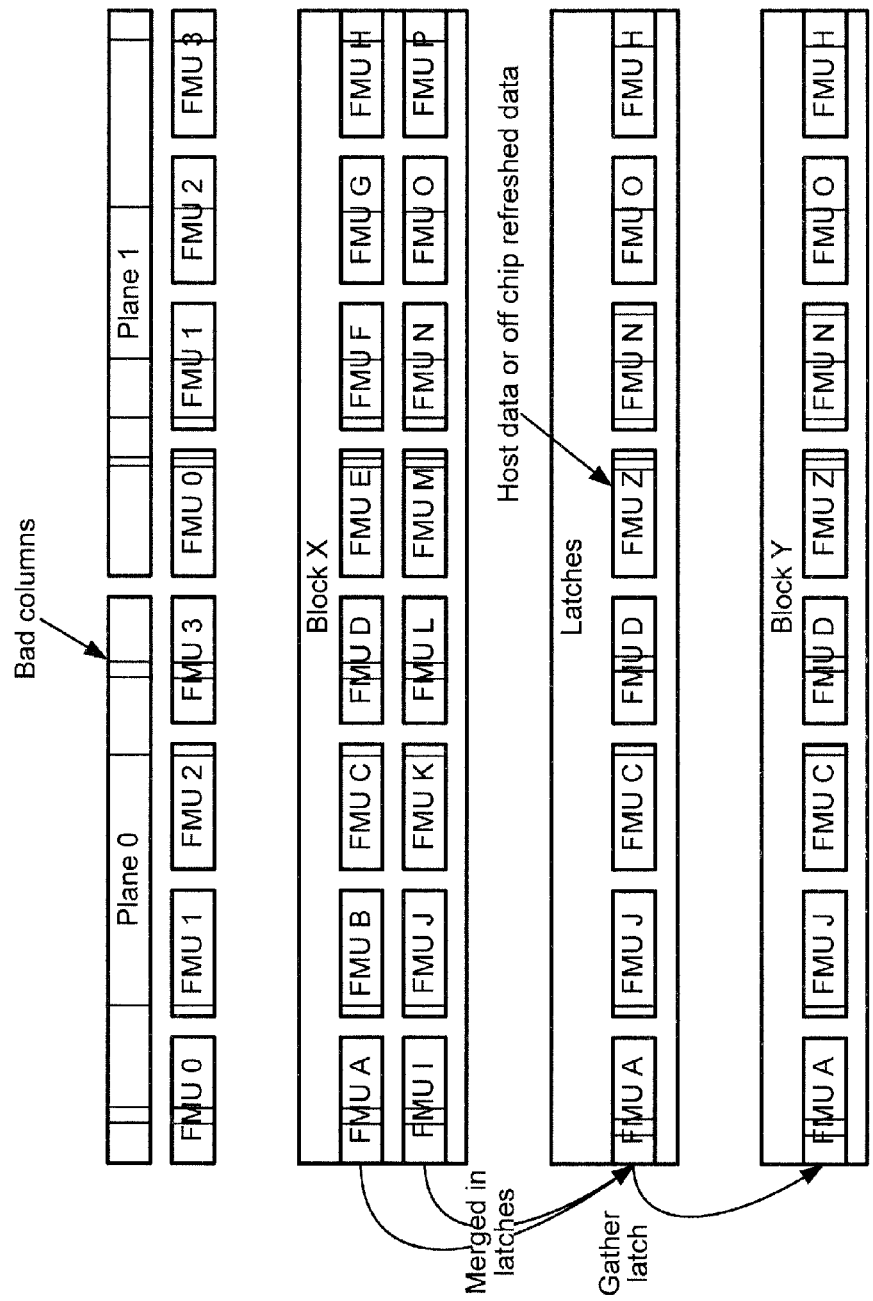
FIG. 8 is an illustration of how alignment can be preserved when using an on-chip copy gather operation of an embodiment.

As shown in FIG. 7, if data from an FMU that has an error (e.g., FMU H) is move to a destination page that also has an error (e.g., FMU 0 in plane 0), the error will accumulate, such that FMU H will have three bad column errors when transferred to the destination word line in block Y.

Various mechanisms can be used to avoid or overcome the accumulation of bad columns. For example, to avoid the problem altogether, the storage module 100 can require that the FMU merges retain FMU alignment (if the alignment can be maintained, there will be no propagation of errors from the bad columns). However, requiring alignment can complicate the firmware code responsible for the compaction, as the code would need to be able to locate valid FMU fragments and understand their alignment in a chip/die/plane/page in order to retain that alignment. Also, a larger pull of data may be needed in order to achieve alignment.

As another example, the storage module 100 can limit the number of "on-chip gather copy" operations by using copy counters, such that it is much lower than the correctable rate by the ECC engine 114. This can be done via individual counters for every FMU. Alternatively, a zone counter can be used where every FMU in a zone assumes the worst count. However, limiting the number of copies may require using off-chip copy to refresh data. Data can be refreshed once in a while and, hence, delay the need for off-chip copies. The threshold can also be adjusted as the number of cycles increases.

As yet another example, the storage module 100 can limit the on-chip gather copy to early in the memory device's life when the data has a lower error rate. So, in this example, the on-chip copy gather can be performed if the storage module 100 determines that the error rate for the memory is below a threshold. By sampling data periodically, the memory device may be able to determine when the error rate has increased. Also, endurance of the memory device may be increased by not using SLC blocks (thereby lowering the WAF). In another alternative, the on-chip gather copy operation is performed, but, during the sense transfer, all or part of the data can be sent to the controller 110 for bit-error testing. This sampling of data can either be done at the beginning of life or after a characterized number of cycles. Like the hybrid method discussed above, this method can save toggle time and power.

Figure 9:
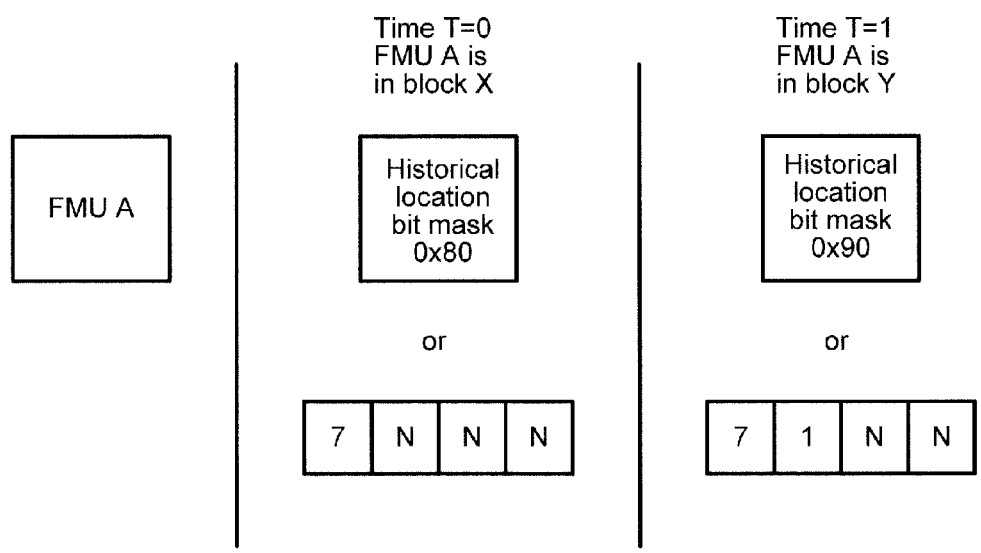
FIG. 9 is an illustration of using bitmask and array format techniques with an on-chip copy gather operation of an embodiment.

In yet another alternative, the storage module 100 can trace the history of FMUs using either an array or a bit mask, as shown in FIG. 9. The entries in the array represent the historical FMU locations of the data (e.g., Hist[0]=Plane 2-FMU2,Hist[1]=Plane1-FMU0). Each bit mask in the array represents the historical FMU location of the data, and the historical location information can be fed into the ECC engine 114 in the form of super bad column tables to assist in the correction. Thus, this embodiment provides the ability to build superset bad column tables into the ECC engine 114 based on history (which is different from the typical method of feeding bad column information into the FCC engine).

In another method, the advantage of doing direct X1-to-X3 copy in a gather mode increases the performance. This performance gain could be sacrificed for slower and gentler X3 programming to add extra margin for potential data loss. This provides a balancing operation. In another alternative, because of complexity in trying to maintain data alignment (maintaining alignment because of bad columns), host data (and or refreshed off chip data) can be combined with on chip gather data.

Finally, as mentioned above, any suitable type of memory can be used. Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged ether to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional exemplary structures described but cover all relevant memory structures within the spirit and scope of the invention as described herein and as understood by one of skill in the art.

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the preferred embodiments described herein can be used alone or in combination with one another.

What is claimed is:

1. A method comprising:
performing the following in a memory that comprises a plurality of word lines and a plurality of data latches:
copying a first error correction code (ECC) page from a first word line into a first data latch;
copying a second ECC page from a second word line into a second data latch;
copying both the first ECC page from the first data latch and the second ECC page from the second data latch into a third data latch; and
copying the first ECC page and the second ECC page from the third data latch to a third word line.

2. The method of claim 1 further comprising maintaining column alignment when copying the first ECC page and the second ECC page from the first and second data latches into the third data latch.

3. The method of claim 1, wherein at least one of the first ECC page or the second ECC page stored in the third word line is in a different column than where the one of the first ECC page or the second ECC page was initially stored in the first or second word line.

4. The method of claim 1 further comprising limiting a number of times an on-chip copy gather operation is performed in the memory.

5. The method of claim 1, wherein the copying is performed only if it is determined that an error rate for the memory is below a threshold.

6. The method of claim 1 further comprising sending at least one of the first ECC page from the first word line or the second ECC page from the second word line to a controller of the device for error testing.

7. The method of claim 1 further comprising performing error correction on at least one of the first ECC page from the first word line or the second ECC page from the second word line using historical error locations from a bit mask.

8. The method of claim 1 further comprising storing data from a host in communication with the device in the third word line, along with the first ECC page and the second ECC page from the third data latch.

9. The method of claim 1, wherein the copying is performed in response to a command from a controller in the device, and wherein the command contains the following fields: source column, source latch name, destination column, destination latch name, and length of copy.

10. The method of claim 1, wherein the memory is a three-dimensional memory.

11. The method of claim 1, wherein the storage module is embedded in a host.

12. The method of claim 1, wherein the device is removably connected to a host.

13. The method of claim 1, wherein the device is a solid-state drive.

14. A device comprising:
a memory comprising a plurality of word lines and a plurality of data latches; and an on-chip copy gather circuit in communication with the memory, wherein the on-chip copy gather circuit is configured to use the plurality of data latches to gather data from portions of source word lines and copy the gathered data to a destination word line.

15. The device of claim 14, wherein the on-chip copy gather circuit is further configured to prevent accumulation of errors from bad columns in the memory.

16. The device of claim 15, wherein the on-chip copy gather circuit is configured to prevent accumulation of errors from bad columns in the memory by maintaining column alignment of the data when copying the gathered data.

17. The device of claim 15, wherein the on-chip copy gather module is configured to prevent accumulation of errors from bad columns in the memory by limiting a number of times an on-chip copy gather operation is performed in the memory.

18. The device of claim 15, wherein the on-chip copy gather circuit is configured to prevent accumulation of errors from bad columns in the memory by performing an on-chip copy gather operation only if it is determined that an error rate for the memory is below a threshold.

19. The device of claim 15, wherein the on-chip copy gather circuit is configured to prevent accumulation of errors from bad columns in the memory by error testing the data.

20. The device of claim 14, wherein the memory is a three-dimensional memory.

21. The device of claim 14, wherein the device is embedded in a host.

22. The device of claim 14, wherein the device is removably connected to a host.

23. The device of claim 14, wherein the device is a solid-state drive.

24. A device comprising:
a memory comprising a plurality of word lines and a plurality of data latches; and
a controller in communication with the memory, wherein the controller is configured to gather a first error correction code (ECC) codeword from a first source word line of a plurality of source word lines and a second ECC codeword from a second source word line of the plurality of source word lines in the memory and copy the gathered first ECC codeword and the second ECC codeword to a destination word line while preventing accumulation of errors from bad columns in the memory.

25. The device of claim 24, wherein the controller is configured to prevent accumulation of errors from bad columns in the memory by maintaining column alignment of the first ECC codeword and the second ECC codeword when copying the gathered first ECC codeword and the second ECC codeword.

26. The device of claim 24, wherein the controller is configured to prevent accumulation of errors from bad columns in the memory by limiting a number of times an on-chip copy gather operation is performed in the memory.

27. The device of claim 24, wherein the controller is configured to prevent accumulation of errors from bad columns in the memory by performing an on-chip copy gather operation only if it is determined that an error rate for the memory is below a threshold.

28. The device of claim 24, wherein the controller is configured to prevent accumulation of errors from bad columns in the memory by error testing at least one of the first ECC codeword or the second ECC codeword.

29. The device of claim 24, wherein the memory is a three-dimensional memory.

30. The device of claim 24, wherein the device is embedded in a host.

31. The device of claim 24, wherein the device is removably connected to a host.

32. The device of claim 24, wherein the device is a solid-state drive.

* * * * *